United States Patent
Yoshimoto et al.

(10) Patent No.: US 9,010,615 B2
(45) Date of Patent: Apr. 21, 2015

(54) BONDING APPARATUS AND BONDING METHOD

(71) Applicant: Fujitsu Semiconductor Limited, Yokohama-shi, Kanagawa (JP)

(72) Inventors: Kazuhiro Yoshimoto, Kawasaki (JP); Yuzo Shimobeppu, Kawasaki (JP); Kazuo Teshirogi, Kawasaki (JP); Yoshiaki Shinjo, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/249,852

(22) Filed: Apr. 10, 2014

(65) Prior Publication Data

US 2014/0217153 A1    Aug. 7, 2014

Related U.S. Application Data

(62) Division of application No. 12/888,972, filed on Sep. 23, 2010, which is a division of application No. 11/503,907, filed on Aug. 15, 2006, now abandoned.

(30) Foreign Application Priority Data

Mar. 17, 2006    (JP) ................................ 2006-075375

(51) Int. Cl.
  *B23K 31/12*    (2006.01)
  *H05K 13/08*    (2006.01)
  (Continued)

(52) U.S. Cl.
  CPC .......... *H05K 13/08* (2013.01); *H01L 21/67144* (2013.01); *H01L 24/75* (2013.01);
  (Continued)

(58) Field of Classification Search
  USPC ....................... 228/102–104, 178–180.5, 8, 9
  See application file for complete search history.

(56) References Cited

U.S. PATENT DOCUMENTS

5,673,844 A    10/1997   Sargent
6,279,810 B1    8/2001   Chan-Wong et al.
(Continued)

FOREIGN PATENT DOCUMENTS

JP    5-218140 A    8/1993
JP    11-074319 A    3/1999
(Continued)

OTHER PUBLICATIONS

Flextest SE & GT, MTS Systems Corporation, 2004, p. 1-16.
(Continued)

*Primary Examiner* — Devang R Patel
*Assistant Examiner* — Carlos Gamino
(74) *Attorney, Agent, or Firm* — Westerman, Hattori, Daniels & Adrian, LLP (57) ABSTRACT

To provide a bonding apparatus capable of increasing product quality by realizing high-precision control of a pressing force applied upon mounting of an electronic component on a substrate by bonding, and to a bonding method capable of providing high-quality products stably. The bonding apparatus includes: at least a bonding head 100 for pressing an electronic component 6 against a substrate 1 to bond it to the substrate 1; a plurality of load detection mechanisms (e.g., load sensors 5) substantially equally spaced so as to face one another under a substrate stage S supporting the substrate 1 provided with the electronic component 6; and a pressure detection unit 20 for detecting pressing force at the bonding surface between the electronic component 6 and substrate 1 on the basis of the pressure values detected by the individual load detection mechanisms 5.

8 Claims, 11 Drawing Sheets

(51) Int. Cl.
*H01L 21/67* (2006.01)
*H01L 23/00* (2006.01)
*H05K 13/04* (2006.01)
*B23K 31/00* (2006.01)

(52) U.S. Cl.
CPC ......... *H01L2224/16* (2013.01); *H01L 2224/75* (2013.01); *H01L 2224/75251* (2013.01); *H01L 2224/75252* (2013.01); *H01L 2224/7592* (2013.01); *H01L 2924/01082* (2013.01); *H01L 2924/01006* (2013.01); *H01L 2924/01033* (2013.01); *H05K 13/04* (2013.01)

(56) References Cited

U.S. PATENT DOCUMENTS

| | | | |
|---|---|---|---|
| 6,291,804 | B1 | 9/2001 | Fujii |
| 6,929,168 | B2 | 8/2005 | Mayer et al. |
| 7,075,036 | B2 | 7/2006 | Ogimoto et al. |
| 7,296,727 | B2 | 11/2007 | Onobori et al. |
| 7,427,517 | B2 | 9/2008 | Okamoto |
| 7,441,688 | B2 | 10/2008 | Van Heerden et al. |
| 7,897,884 | B2 * | 3/2011 | Harish ............ 177/25.13 |
| 2002/0109001 | A1 | 8/2002 | Ou et al. |
| 2005/0121499 | A1 | 6/2005 | Heerden et al. |
| 2006/0016541 | A1 | 1/2006 | Caskey et al. |
| 2009/0057371 | A1 | 3/2009 | Kashiki et al. |

FOREIGN PATENT DOCUMENTS

| | | |
|---|---|---|
| JP | 11-251366 A | 9/1999 |
| JP | 2000-183114 A | 6/2000 |
| JP | 2001-068895 A | 3/2001 |
| JP | 2001-223244 A | 8/2001 |
| JP | 2002-076061 A | 3/2002 |
| WO | 2005/067046 A1 | 7/2005 |

OTHER PUBLICATIONS

Japanese Office Action dated Jun. 14, 2011, issued in corresponding Japanese Patent Application No. 2006075375.

* cited by examiner

BONDING APPARATUS AND BONDING METHOD

CROSS-REFERENCE TO RELATED APPLICATIONS

This application is a divisional of U.S. application Ser. No. 12/888,972, filed Sep. 23, 2010, which is a divisional of U.S. application Ser. No. 11/503,907, filed on Aug. 15, 2006 which is based upon and claims the benefits of the priority from the prior Japanese Patent Application No. 2006-075375 filed on Mar. 17, 2006, the entire contents of which are incorporated herein by reference.

BACKGROUND OF THE INVENTION

1. Field of the Invention

The present invention relates to a bonding apparatus capable of increasing product quality by realizing high-precision control of a pressing force applied upon mounting of an electronic component on a substrate by bonding, and to a bonding method capable of providing high-quality products stably.

2. Description of the Related Art

Electronic devices (e.g., computers) have become faster and smaller, and there is an increasing demand for high-density packaging of electronic components. Against this background, substrates for large scale integration have been used, in which a plurality of electronic components is arranged on a substrate in layers. In addition, for tighter packing of electronic components, flip-chip bonding has been employed in which bumps are formed on an electronic component that is to be mounted on a substrate, and the bumps are then pressed against the substrate and welded thereto. High pin count and device miniaturization have been realized in this approach, with an increasing demand for reduced bump diameter and reduced pitch between bump connection terminals.

However, if bump connection terminal pitch reaches as small as 40 μm or less, a concern arises regarding the occurrence of connection defects, such as short-circuits between terminals, and damages to the electric component if it fails to achieve high-precision positioning (tolerances to ±1 μm) and/or stable load control because of variations in the fabrication precision of the substrate and in the formation of bumps. Short circuits between terminals occur due to, for instance, excessively crushed bumps and displacement after recognition. Damages to the electronic component include failures of, for example, bumps and terminals of the electronic component and substrate.

The following bonding apparatus has been conventionally used for electronic component bonding: A bonding apparatus which has a bonding tool provided so as to be capable of moving up and down, and a load sensor for detecting load that has been applied to an electronic component by the bonding tool. In such a bonding apparatus the load sensor is provided on the upper side of the bonding tool support and the load sensor is allowed to contact the bonding tool support to cause both a bonding head attached with the bonding tool and load sensor to move down, bonding the electronic component to the substrate. The bonding apparatus is so configured that, at this point, load (pressing force) applied by the bonding tool is detected by the load sensor that is in contact with the bonding tool.

The followings are specific examples of conventional bonding apparatus used: A bonding apparatus in which a bonding tool support is suspended from a head unit by a spring (see Japanese Patent Application Laid-Open (JP-A) No. 2000-183114); a bonding apparatus equipped with two different load detection mechanisms: one configured to detect decreasing load, and one configured to detect increasing load, at a time when a given level of load applied to a bonding tool support has caused a bonding tool to press an electronic component (see Japanese Patent Application Laid-Open (JP-A) No. 2002-76061); a bonding apparatus configured to carry out feedback control by previously creating a given level of thrust in a cylinder (see Japanese Patent Application Laid-Open (JP-A) No. 2001-68895); and a bonding apparatus in which a bonding head is provided with a parallelism adjustment mechanism by which the parallelism of a bonding tool is determined by a parallelism detection sensor (see Japanese Patent Application Laid-Open (JP-A) No. 2001-223244).

However, when high-precision positioning and high-precision load control are required in connection with reduced pitch between bump connection terminals, variations occur in the in-plane stress due to variations in the precision of components (e.g., substrates and bumps), even though the detected load values falls within a set reference load for a bonding operation, leading to reduced product yields due to connection failures and the like.

With respect to the set reference load—a whole pressure created during a bonding operation—there arises the following problem: The bonding tool support is provided with a number of components: mechanical sections (e.g., slide guides, a shaft, a cylinder and a spring) that constitute a lifting and lowering mechanism; mechanical sections for attaching and cooling an electronic component and for adjusting the inclination of the electronic component; and a number of parts (e.g., wires and pipes) for connecting these mechanical sections together. Thus, in a case of a load sensor provided on the upper side of the bonding tool support, available locations or areas for the load sensor are limited. In addition, the load sensor is susceptible to heat generated due to friction of the components and thus tends to produce different values for the detected load. The measured pressure value only means the load applied to the bonding tool support, and includes escaping loads such as inclined loads acting on the components, and horizontal components. For this reason, the measured load value is not necessarily equal to the value for load acting on the bonding portions, thus requiring periodical load calibration.

Accordingly, bonding apparatuses with conventional load detection mechanisms, as disclosed in the foregoing Patent Literatures, cannot achieve further increase in the product quality; therefore, bonding technology has been sought after that enables high-precision pressing force control for increased product quality.

It is an object of the present invention to solve the foregoing conventional problems and to achieve the object described below.

Specifically, it is an object of the present invention to provide a bonding apparatus capable of increasing product quality by realizing high-precision control of a pressing force applied upon mounting of an electronic component on a substrate by bonding, and to a bonding method capable of providing high-quality products stably.

SUMMARY OF THE INVENTION

The following is the means for solving the foregoing problems:

The bonding apparatus of the present invention includes at least: a bonding head configured to press an electronic component against a substrate to bond the electronic component to the substrate; a plurality of load detection mechanisms that are substantially equally spaced so as to face one another under a substrate stage which supports the substrate arranged to face the electronic component; and a pressure detection unit configured to detect a pressure on a bonding surface between the electronic component and the substrate on the basis of pressure values detected by the individual load detection mechanisms.

In this bonding apparatus the plurality of load detection mechanisms is provided under the substrate stage in such a way that they are substantially equally spaced so as to face one another, for example, in a matrix form. For this reason, spaces on a planar surface where such load detection mechanisms are arranged can be more readily secured in the bonding apparatus of the present invention than in conventional ones where the load detection mechanisms are arranged in the vicinity of the bonding tool support. In addition, there are no complex components around the load detection mechanisms and there is no need to move up or down them, thus allowing detection of the net load applied to the substrate stage. Furthermore, the provision of the plurality of load detection mechanisms allows measurement of the pressure distributed over the substrate stage surface and high-precision control of a pressing force of the bonding head. Thus, it is possible to increase product quality.

The bonding method of the present invention includes at least a pressing step of pressing an electronic component against a substrate by means of a bonding head to bond the electronic component to the substrate; and a pressure detection step of detecting a pressure at a bonding surface between the electronic component and the substrate on the basis of pressure values detected by a plurality of load detection mechanisms that are substantially equally spaced so as to face one another under a substrate stage which supports the substrate arranged to face the electronic component.

With this bonding method, in the pressing step, the electronic component is first pressed against the substrate by means of the bonding head and is thereby bonded to the substrate. In the pressure detection step, the pressure at a bonding surface between the electronic component and the substrate is detected on the basis of pressure values detected by a plurality of load detection mechanisms that are substantially equally spaced so as to face one another under a substrate stage which supports the substrate arranged to face the electronic component. As a result, the net load applied to the substrate stage is detected, the pressure distributed over the substrate stage surface is measured, and the pressing force of the bonding head is controlled with high precision. Thus, it is possible to stably provide high-quality products with high yields.

DESCRIPTION OF THE PREFERRED EMBODIMENTS

Hereinafter, the bonding apparatus and bonding method of the present invention will be described in detail with reference to the drawings.

Embodiment 1

The first embodiment of the bonding apparatus of the present invention will be described with reference to the drawings.

Figure 1:
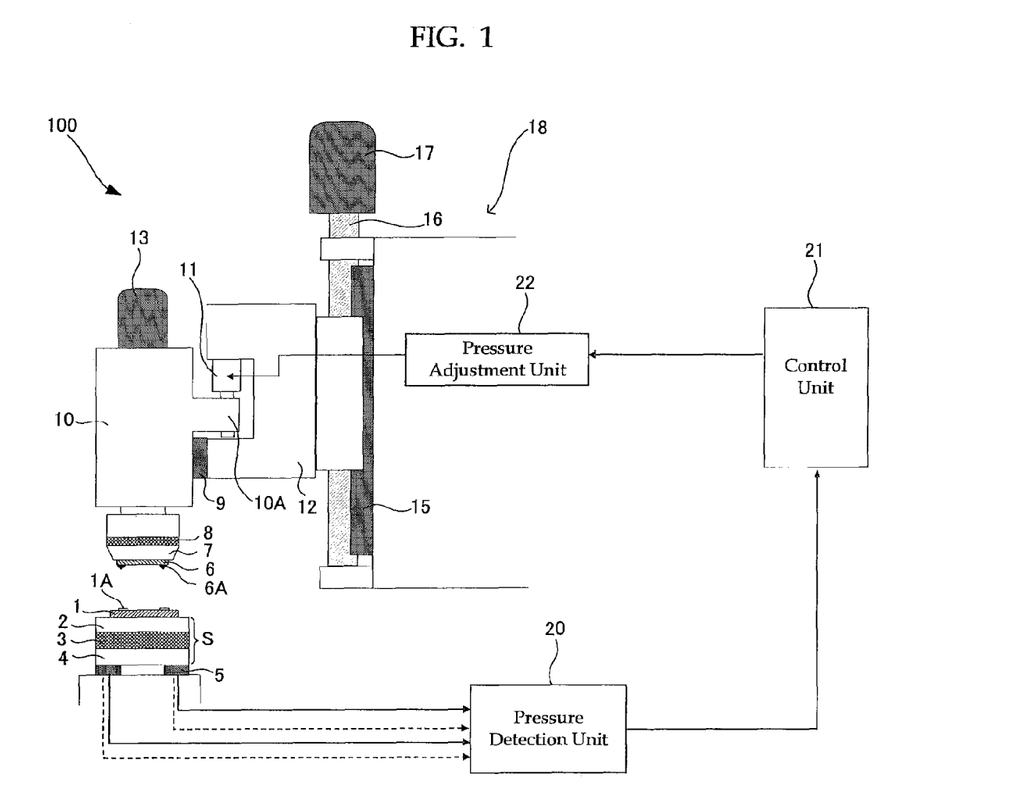
FIG. 1 is a cross sectional view for explaining a schematic configuration of a bonding apparatus of a first embodiment of the present invention.

FIG. 1 is a cross-sectional view showing a schematic configuration of the bonding apparatus according to the first embodiment of the present invention.

The bonding apparatus shown in FIG. 1 is one carrying out flip chip bonding, and has a bonding head 100. The bonding head 100 has a function of heating and pressurizing (pressing) an electronic component having bumps to bond the bumps to connection terminals of a substrate 1.

As shown in FIG. 1, the bonding head 100 includes a bonding tool support 10 having a bonding tool 7 which operates by attaching thereto an electronic component 6 by vacuum and a heat mechanism 8 for heating the bonding tool 7 to heat bumps 6A formed on the electronic component 6 to thereby set bonding temperature to about 180° C. to 350° C. In the bonding tool support 10, a protruding part 10A is engaged with a cylinder 11 attached to a C-shaped lifting and lowering block 12, and is held by the lifting and lowering block 12 via a slidable slide guide 9. In addition, a θ motor 13 is arranged on the top of the bonding tool support 10. The θ motor 13 carries out a θ rotation correction upon positioning of the electronic component 6.

Note that the cylinder 11 may be used without changing its thrust or may be used while changing its thrust by means of a later-described pressure adjustment unit 22 (e.g., an electropneumatic regulator), which makes cylinder thrust variable by feedback control.

The lifting and lowering block 12 is connected to a lifting and lowering mechanism 18 which is comprised of a slide guide 15, a feed screw 16, and a Z motor 17 arranged on the top of the feed screw 16, and the flat side wall of the C-shaped lifting and lowering block 12 is held by the feed screw 16 via the slidable slide guide 15. When load is applied to the electronic component 6 more than necessary, the lifting and lowering block 12 connected to the lifting and lowering mechanism 18 is allowed to move up and down for feedback control on the set load, protecting the substrate 1, electronic component 6, load sensor 5, etc. from damages.

The substrate 1 having connection terminals 1A formed thereon is placed on a substrate attachment plate 2 that holds the substrate 1 by vacuum. Under the substrate attachment plate 2, a substrate heater 3 for heating the substrate 1 and heat insulating material 4 are provided. The heat insulating material 4 is supported by a matrix of four load sensors 5 positioned at the four corners of the heat insulating material 4.

Note in this embodiment that the substrate attachment plate 2, substrate heater 3 and heat insulating material 4 constitute a substrate stage S.

Signals from these load sensors 5 are then detected by a pressure detection unit 20 (e.g., an A/D converter) and transmitted to a control unit 21 for measurement of both the total load on the bumps 6A of the electronic component 6 and the pressure distributed over the substrate stage S surface and for control of the pressure adjustment unit 22. In this way, set load for bonding operations is controlled.

Conventionally, the rating of a load sensor is so determined that it can support a maximum set load adopted for a bonding apparatus; within a load range up to 490,33N (50 kgf), 490,33N (50 kgf) is generally adopted for the rating of load sensors for high-pressure detection, and 49.03N (5 kgf) for the rating of load sensors for low-pressure detection. For this reason, when a set load ranges from 49.03N (5 kgf) to 147.10N (15 kgf), the load sensor is rated at 50 kgf, which results in poor precision.

The bonding apparatus according to the first embodiment of the present invention, however, has four load sensors 5 and thus a maximum load is equally shared by them. For this reason, even when a maximum load of 490,33N (50 kgf) is applied, the load on per one load sensor 5 is reduced by a factor of 4 (i.e., 122.58N (12.5 kgf)). Thus, it is possible to increase the linearity of the hysteresis curve and/or hysteresis characteristics by reducing the ratings of the load sensors 5.

The operation frequency of the lifting and lowering mechanism that has the slide guides, spring, cylinder, etc. is very high in view of the units of the semiconductor device manufactured. The lifting and lowering mechanism is susceptible to heat generated due to friction of the foregoing complex components; thus, the status of the bonding apparatus is likely to change accordingly. The bonding apparatus according to the first embodiment of the present invention, however, has no complex lifting and lowering mechanism and has a matrix of the immobilized four load sensors 5 under the substrate 1, allowing detection of the net load applied to the portions where the bumps 6A and corresponding connection terminals 1A are bonded together, and of the pressure distributed over the substrate stage S surface.

Figure 2:
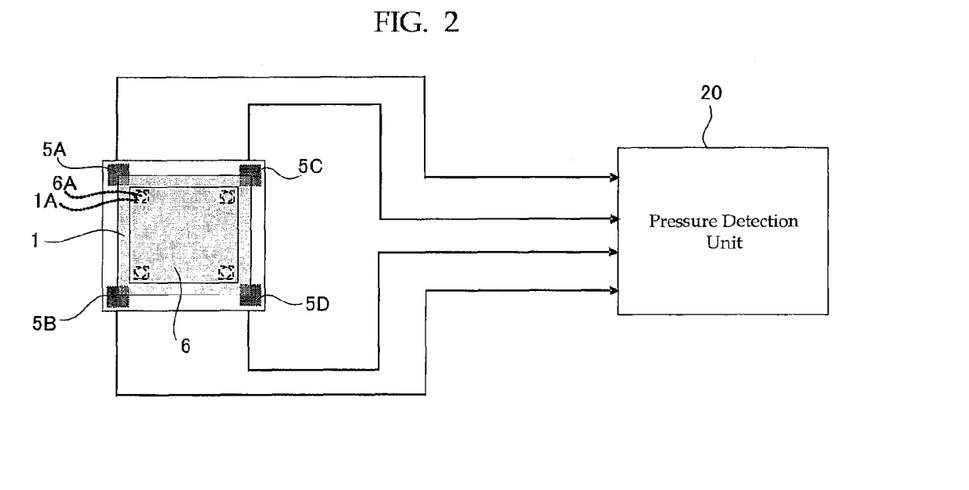
FIG. 2 is a plan view for explaining a schematic configuration of a load detection mechanism in the bonding apparatus of the first embodiment of the present invention.

Next, the load detection mechanism in the bonding apparatus according to the first embodiment of the present invention will be described. FIG. 2 is a plan view showing the load detection mechanism in the bonding apparatus.

As shown in FIG. 2, the substrate 1 is attached by vacuum to the substrate attachment plate 2 that has a vacuum aspiration groove corresponding to the shape of the substrate 1. The substrate heater 3 for heating the substrate 1 is provided under the substrate attachment plate 2, heating the substrate 1 to about 100° C. in general. The load sensors 5 are provided under the substrate heater 3 with the heat insulating material 4 interposed between them. The permissible temperature range for the load sensors 5 generally ranges from about 50° C. to 100° C., and therefore, both the load sensors 5 and a drive unit (not shown) that moves the substrate stage S need to be protected against heat (about 180° C. to 350° C.) generated upon heating of the substrate 1 and bonding of the electronic component 6. To this end, the heat insulating material 4 and a cooling mechanism (not shown) are arranged.

In this embodiment the four load sensors 5—the first load sensor 5A, second load sensor 5B, third load sensor 5C, and fourth load sensor 5D—are substantially equally spaced along the perimeter of the substrate attachment plate 2 so as to face one another, forming a matrix of load sensors provided at positions corresponding to the four corners of the substrate attachment plate 2, as shown in FIG. 2. The detection signal from each of the load sensors 5A to 5D is outputted to the control unit 21 via the pressure detection unit 20 (e.g., an A/D converter).

Figure 3A:
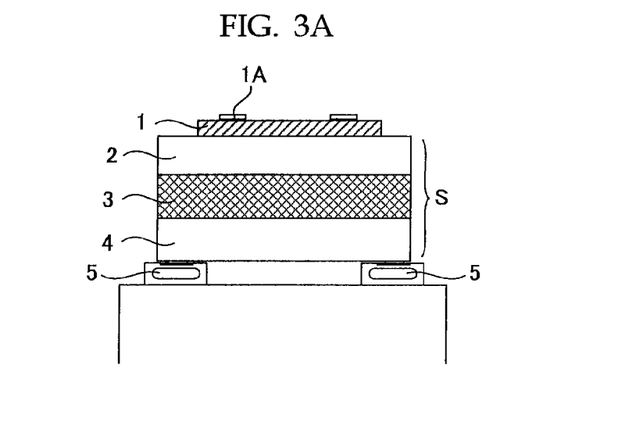
FIG. 3A is a first schematic explanatory diagram of an example of a modification of the load detection mechanism in the bonding apparatus of the first embodiment of the present invention.
Figure 3B:
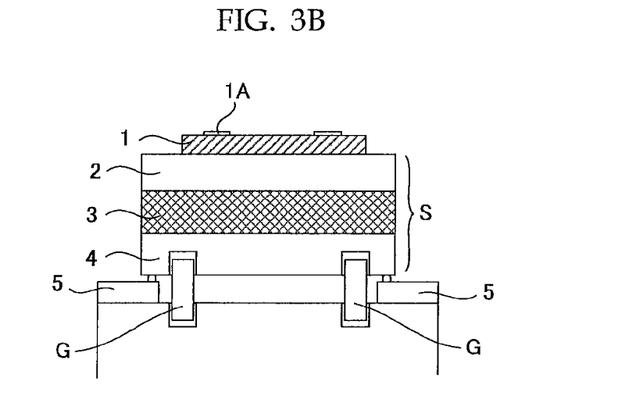
FIG. 3B is a second schematic explanatory diagram of an example of a modification of the load detection mechanism in the bonding apparatus of the first embodiment of the present invention.
Figure 3C:
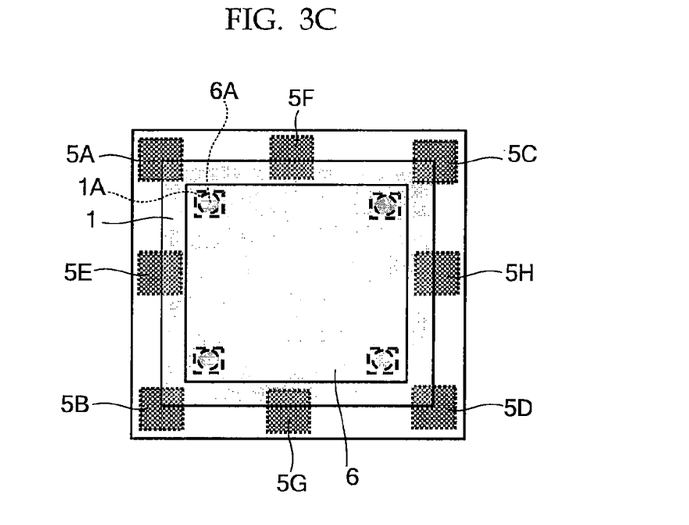
FIG. 3C is a third schematic explanatory diagram of an example of a modification of the load detection mechanism in the bonding apparatus of the first embodiment of the present invention.

The shape and locations of the load sensors 5 are not particularly limited; various modifications can be made as described below. For example, as shown in FIG. 3A, the substrate stage S may be immobilized by means of strain gauges as the load sensors 5. As shown in FIG. 3B, other mechanisms (e.g., load cells) as the load sensors 5 may be combined, and a guide part G may be provided to make the substrate stage S mobile. As shown in FIG. 3C, in addition to the foregoing load sensors 5A to 5D, additional four load sensors—the fifth load sensor 5E, sixth load sensor 5F, seventh load sensor 5G, and eighth load sensor 5H—may be provided in such a way that they are substantially equally spaced along the perimeter of the substrate attachment plate 2 so as to face one another in a matrix form. As shown in FIG. 3C, as the number of the load sensor 5 increases (8 in FIG. 3C), so too does the number of load detection points, allowing acquisition of more detailed load detection data.

Figure 4:
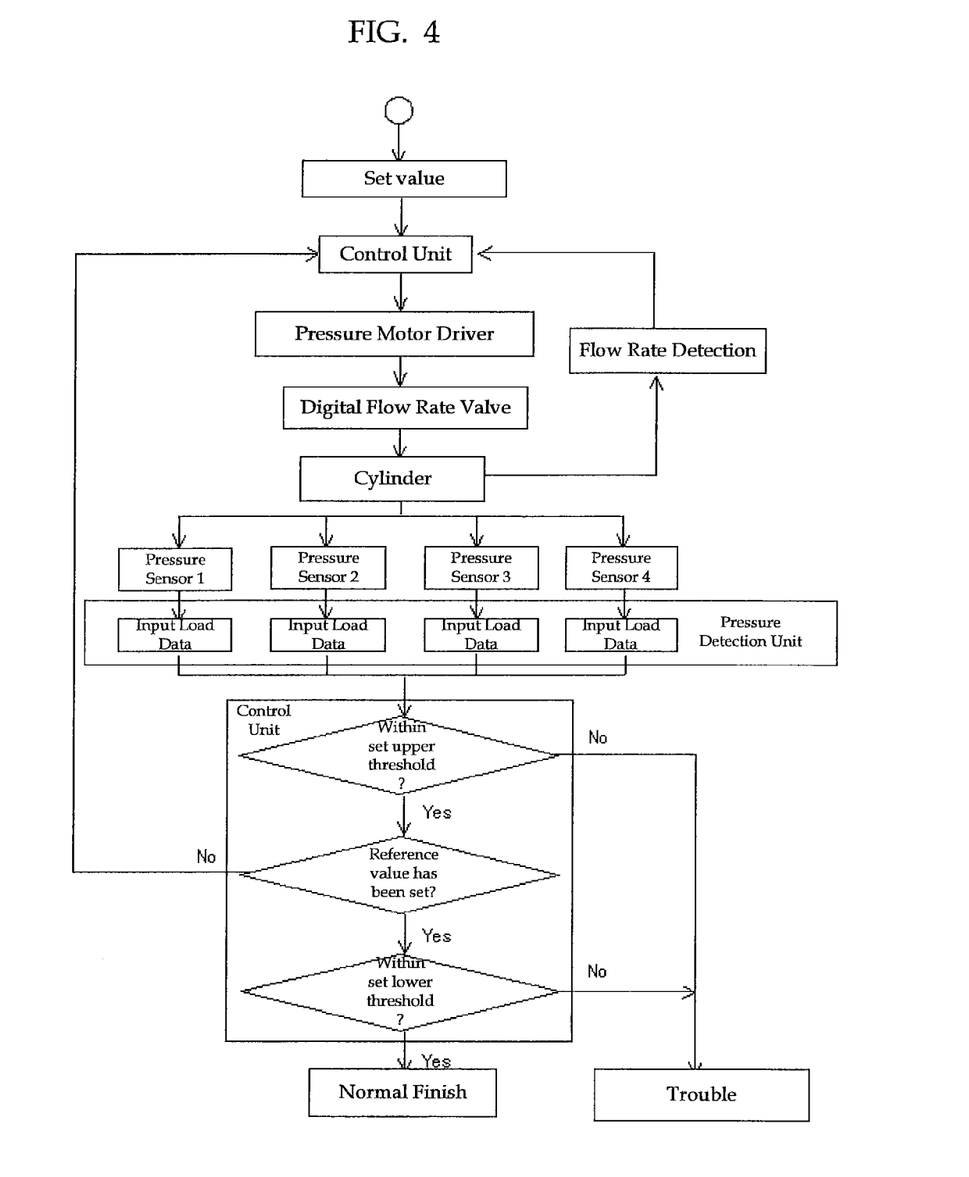
FIG. 4 is a flowchart for explaining an operation (bonding method) of the bonding apparatus of the first embodiment of the present invention.

The bonding operation (bonding method of the present invention) carried out by the bonding apparatus will be described with reference to the flowchart shown in FIG. 4.

As a pressure load (whole bonding load) applied to bond the connection terminals 1A of the substrate 1 to the bumps 6A of the electronic component 6, a reference pressure and the descending speed of the bonding tool 7 are set by the control unit 21 (e.g., a microcomputer). In this embodiment, pressure values detected by the load sensors 5A to 5D are used to set the upper and lower thresholds for a pressing force on each of the load sensors 5A to 5D. The thresholds are appropriately determined according to the constitutional material, structure, size, etc. of the substrate 1, bumps 6A, etc. Alternatively, they can be determined by detecting either pressure acting on one load sensor positioned at one corner of an electronic component or pressure acting on a side of the electronic component having a combination of load sensors (i.e., pressure acting on a row of load sensors), on the basis of the pressure acting on one bump, data concerning the connection terminal strength that results in defects, etc. Moreover, if the pressing force exceeds the thresholds, alarm notifications are sent and/or the apparatus operation is halted, enabling early notification of the occurrence of abnormalities.

Figure 5A:
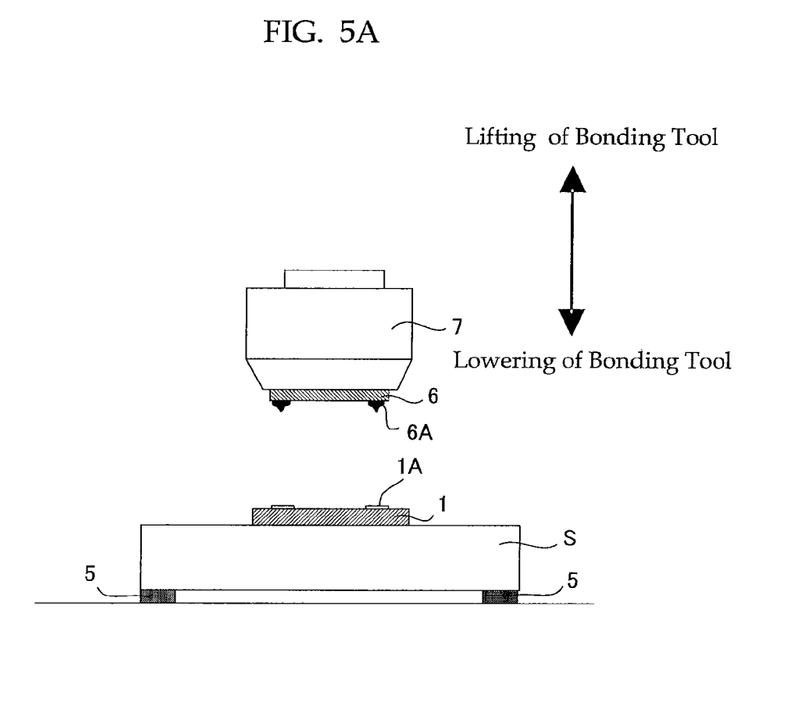
FIG. 5A is a first schematic explanatory diagram showing a bonding operation by means of a bonding method using the bonding apparatus of the first embodiment of the present invention.
Figure 5B:
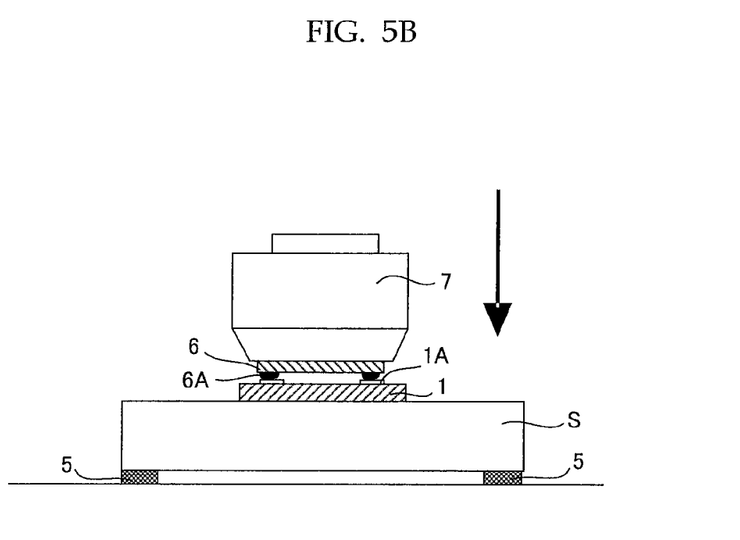
FIG. 5B is a second schematic explanatory diagram showing the bonding operation by means of a bonding method using the bonding apparatus of the first embodiment of the present invention.

As shown in FIG. 5A, in a bonding operation, the bonding tool 7 is moved down by means of the lifting and lowering mechanism 18, so that bonding load has a reference pressure. In this way the electronic component 6 attached to the bonding tool 7 by vacuum moves down toward the connection terminals 1A formed on the substrate 1. As shown in FIG. 5B, pressure values, detected by the load sensors 5A to 5D during a period from the time when the electronic component 6 and substrate 1 make first contact to the time when the bonding tool 7 is completely lifted after a predetermined period of a bonding operation, are transmitted to the control unit 21. As shown in FIG. 4, the control unit 21 then compares the predetermined reference pressure with the total of the pressure values detected by the load sensors 1 to 4 (load sensors 5A to 5D) to perform feedback control on the pressure adjustment unit 22. In this way a digital flow rate-regulating valve is adjusted by a pressure motor driver to adjust the flow rate in the cylinder 11. The flow rate in the cylinder 11 is detected and transmitted to the control unit 21. Each of the detected pressure values thus sampled is compared with the upper and lower thresholds for the pressing force that have been previously set for one corner and one side of the electronic component 6. When the detected pressure values—even within the set reference pressure—exceeded these upper and lower thresholds, it is determined that abnormalities have occurred, followed by sending of alarm notification and halt of the apparatus operation. Thus, the electronic component 6 can be protected from being damaged. Moreover, detected pressure values sampled for each bonding operation can be monitored over time, stored as a manufacture status history. It is therefore possible to increase product quality and to ensure traceability of products.

Figure 6A:
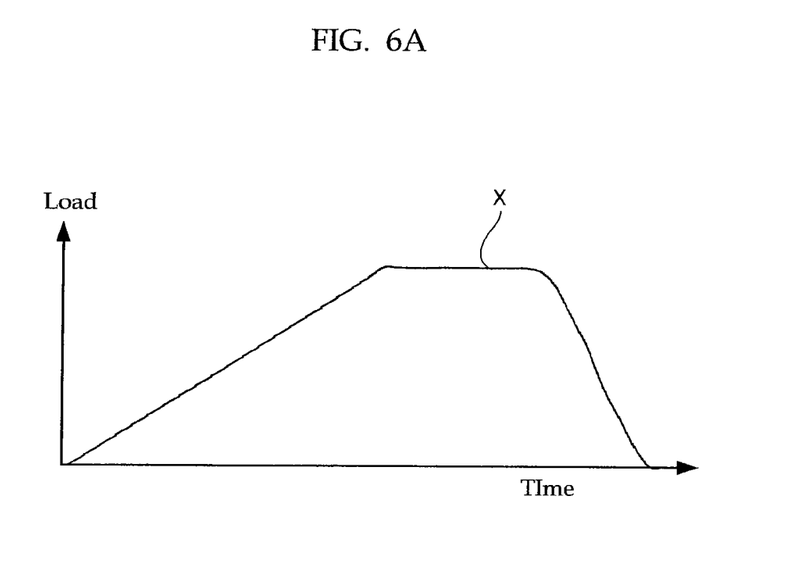
FIG. 6A is graph showing an example of a plot of reference load vs. time in the bonding apparatus of the first embodiment of the present invention.
Figure 6B:
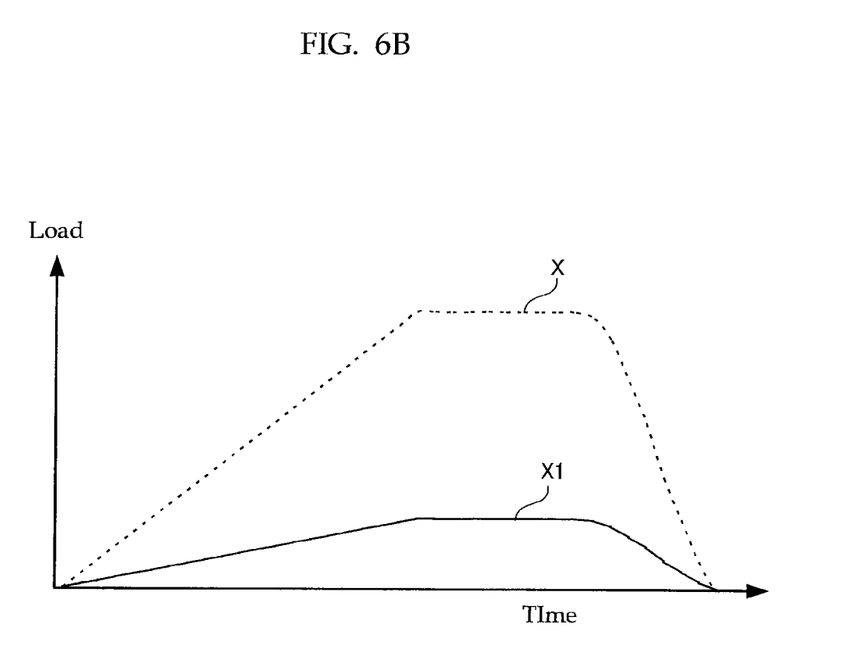
FIG. 6B is graph showing an example of a plot of load vs. time, the load detected by an individual load sensor of the bonding apparatus of the first embodiment of the present invention.

Next, with reference to FIGS. 6A and 6B, description will be provided how the load sensors 5A to 5D detect pressure.

A graph as shown in FIG. 6A is given by plotting the change in X, a bonding load reference pressure (reference pressure per one electronic component), versus time. The bonding load reference pressure equals to the total of the pressure values, which have been detected by the load sensors 5A to 5D during a period from the time when a reference pressure is applied to the electronic component 6 as a result of contact between the electronic component 6 and substrate 1 to the time when the bonding tool 7 is completely lifted after a predetermined period of a bonding operation.

When the load sensors 5A to 5D are equally pressed, X1, a detected pressure value per one load sensor, is four times as small as the bonding load reference pressure X, as shown in FIG. 6B. This means that load is equally distributed on the bumps 6A of the electronic component 6. In this state, there is no concern for damages to the electronic component 6.

Figure 7A:
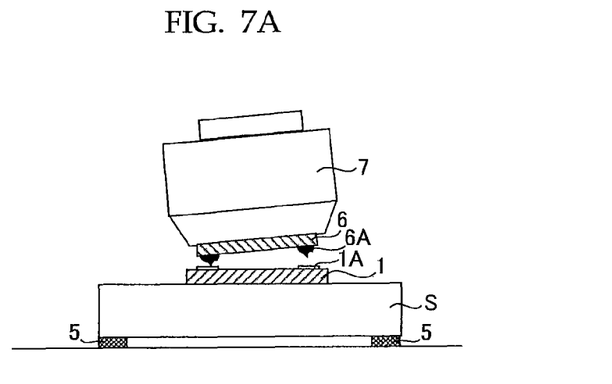
FIG. 7A is a first schematic explanatory diagram showing an example of trouble that occurs during a bonding operation carried out by means of the bonding method using the bonding apparatus of the first embodiment of the present invention.
Figure 7B:
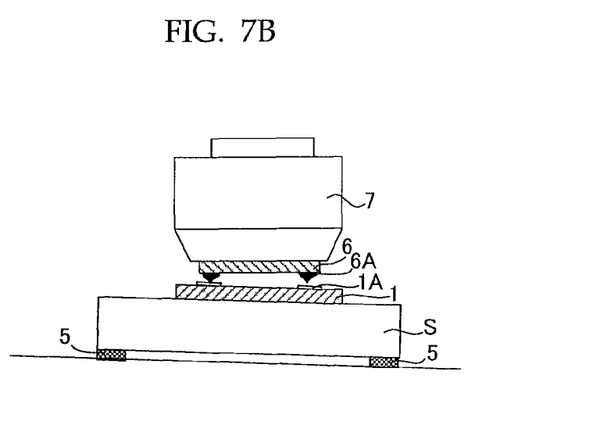
FIG. 7B is a second schematic explanatory diagram showing an example of trouble that occurs during a bonding operation carried out by means of the bonding method using the bonding apparatus of the first embodiment of the present invention.
Figure 7C:
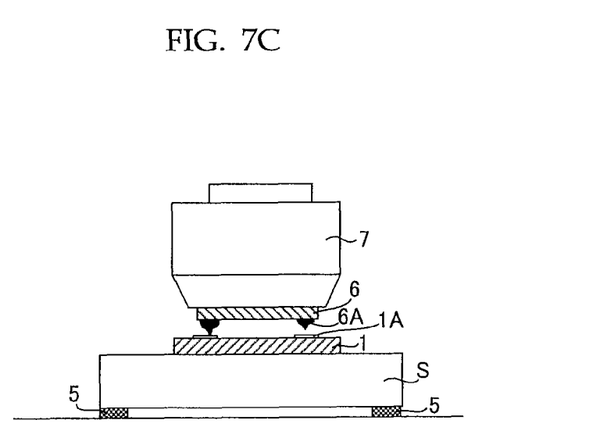
FIG. 7C is a third schematic explanatory diagram showing an example of trouble that occurs during a bonding operation carried out by means of the bonding method using the bonding apparatus of the first embodiment of the present invention.
Figure 7D:
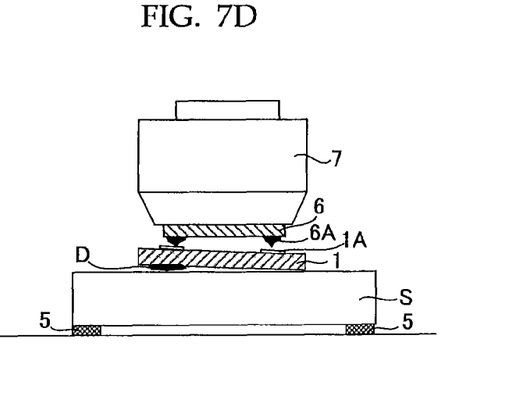
FIG. 7D is a fourth schematic explanatory diagram showing an example of trouble that occurs during a bonding operation carried out by means of the bonding method using the bonding apparatus of the first embodiment of the present invention.
Figure 7E:
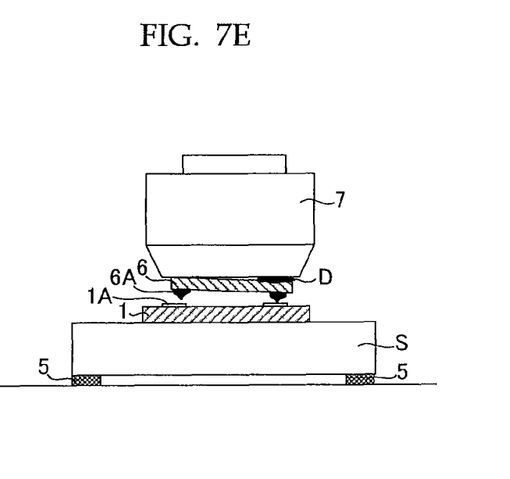
FIG. 7E is a fifth schematic explanatory diagram showing an example of trouble that occurs during a bonding operation carried out by means of the bonding method using the bonding apparatus of the first embodiment of the present invention.
Figure 7F:
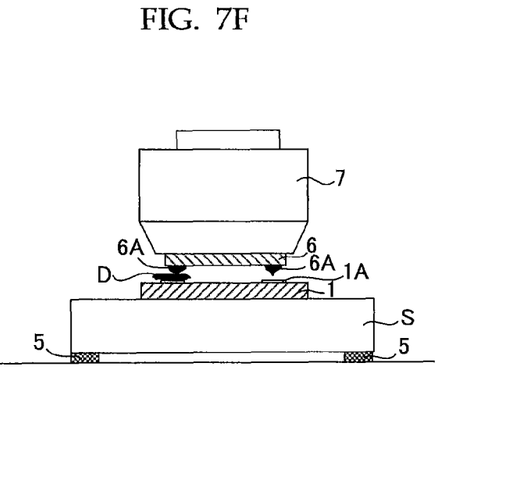
FIG. 7F is a sixth schematic explanatory diagram showing a example of trouble that occurs during a bonding operation carried out by means of the bonding method using the bonding apparatus of the first embodiment of the present invention.

Troubles that occur during a bonding operation are shown in FIGS. 7A to 7F. In FIG. 7A, the bonding tool 7 is inclined and is out of parallelism relative to the substrate stage S. In FIG. 7B, the substrate stage S is inclined and is out of parallelism relative to the bonding tool 7. In FIG. 7C, the bumps 6A are different in height. In either case, connection failures have occurred between the connection terminals 1A and bumps 6A. In FIG. 7D, foreign material D is trapped between the substrate 1 and substrate stage S. In FIG. 7E, foreign material D is trapped between the electronic component 6 and bonding tool 7. In FIG. 7F, foreign material D is trapped between the connection terminal 1A and bump 6A. In either case, connection failures have occurred. In addition, such connection failures occur due to, for example, variations in the substrate and in the chip thickness. Load detection mechanisms in conventional bonding apparatus cannot find such connection failures, and a bonding operation finishes after application of a bonding load reference pressure X (total load reference pressure per one electronic component) shown in FIG. 6B. In the first embodiment of the present invention, however, since thresholds are set for each of the pressure values detected by the plurality of load sensors 5, it is possible to detect abnormalities such as connection failures. As described above, with conventional loading detection mechanisms, no abnormalities can be detected upon occurrence of component crash, connection failures, etc., continuing manufacturing operations. More specifically, load to be applied over the electronic component converges to a particular point, resulting in electronic component failure and reduced production yields. According to the present invention, however, it is possible to increase product quality and production yields.

Figure 8A:
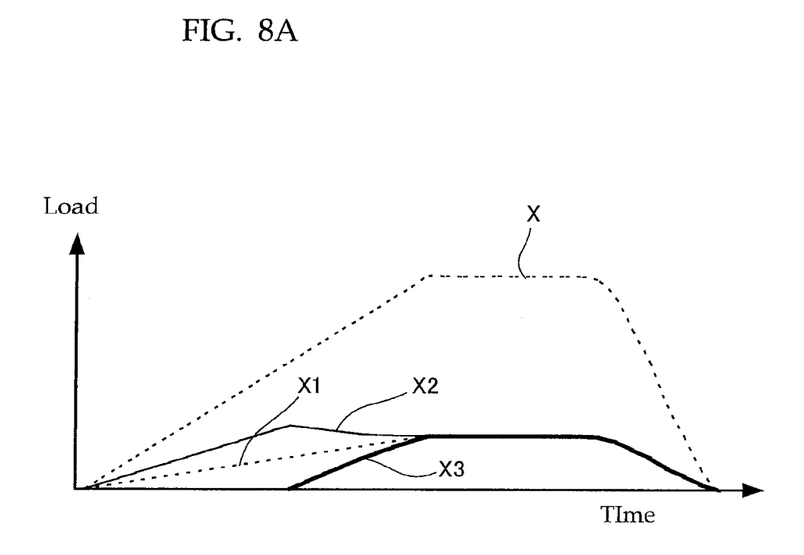
FIG. 8A is a first graph showing another plot of load vs. time, the loads detected by the individual load sensors of the bonding apparatus of the first embodiment of the present invention.

Even when such abnormalities are minor ones that disappear as the bumps 6A of the electronic component 6 deform, the load sensors 5A to 5D in this embodiment produce different values for the detected pressure, allowing detection of such minor abnormalities. To be more specific, for example, when the bonding tool 7 and substrate stage S are out of parallelism as shown in FIGS. 7A and 7B and accordingly the electronic component 6 is inclined such that load is first applied to the load sensors 5A and 5B shown in FIG. 2, the bonding apparatus is so controlled that a bonding load reference pressure is applied to them at a predetermined rate. For this reason, the load detected by the load sensors 5A and 5B increases first as indicated by X2 of FIG. 8A and later on, as the bumps 6A deforms by application of pressure, load is also applied to the load sensors 5C and 5D as indicated by X3.

Figure 8B:
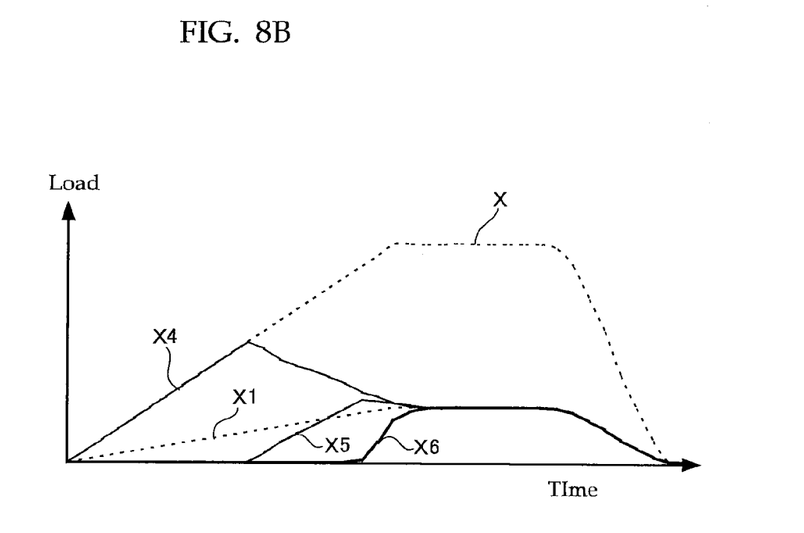
FIG. 8B is a second graph showing still another plot of load vs. time, the loads detected by the individual load sensors of the bonding apparatus of the first embodiment of the present invention.
Figure 9A:
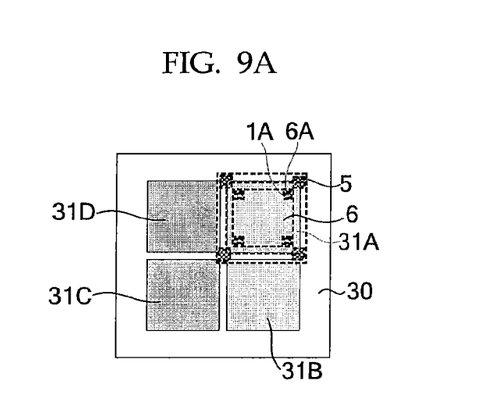
FIG. 9A is a first step view for explaining a substrate transportation operation carried out in the bonding apparatus of the first embodiment of the present invention.
Figure 9B:
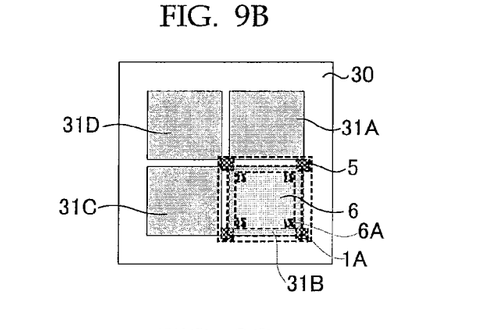
FIG. 9B is a second step view for explaining the substrate transportation operation carried out in the bonding apparatus of the first embodiment of the present invention.
Figure 9C:
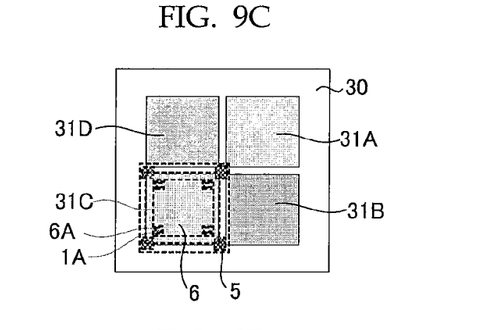
FIG. 9C is a third step view for explaining the substrate transportation operation carried out in the bonding apparatus of the first embodiment of the present invention.
Figure 9D:
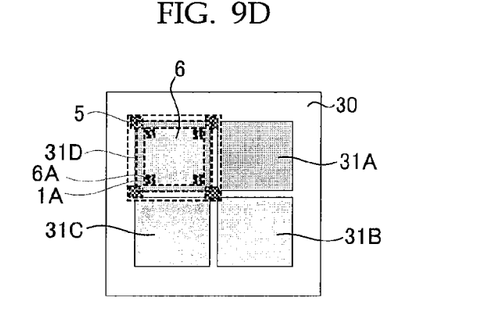
FIG. 9D is a fourth step view for explaining the substrate transportation operation carried out in the bonding apparatus of the first embodiment of the present invention.

Similarly, when the electronic component 6 is inclined such that load is applied only to the load sensor 5A at an early stage, as shown in FIG. 8B, the load detected by the load sensor 5A increases first as indicated by X4. As the bumps 6A deforms by application of load, load is also applied to the load sensors 5B and 5C as indicated by X5 and finally, load is applied to the load sensor 5D as indicated by X6. Variations in load values among the load sensors 5A to 5D begin to decrease from the time when load is uniformly applied to them.

Thus, there is a time-lag before all of the load sensors 5A and 5D are uniformly pressed. However, the bonding apparatus according to this embodiment can detect such a time lag. Load sensors that are first pressed tend to produce higher values for the detected pressure than other load sensors; therefore, loads acting on components (e.g., the electronic component 6, bumps 6A, and connection terminals 1A on the substrate 1) are compared with the upper and lower thresholds for the pressing force that are previously set for one corner and one side of the electronic component 6, allowing monitoring whether components in the resulting products have been fabricated within the allowable strength range. Thus, it is possible to increase product quality and reliability.

In this embodiment, although a bonding operation has been made for one element on the substrate 1 as described above, similar bonding operations can be made for a plurality of elements arranged on one substrate. For example, when four elements 31A to 31D are arranged on a substrate 30 as shown in FIGS. 9A to 9D, the substrate stage may be fixed and then the substrate 30 may be moved for the bonding of individual electronic components 6 in the order from FIG. 9A to FIG. 9D. Alternatively, in this case, the substrate stage may be divided into several sections before performing bonding operations. These embodiments are suitable for multiple bonding and, what is more, are mechanically allowable, for example, for semiconductor devices with high pin count and large-area semiconductor devices, which require high load during a bonding operation.

With the bonding apparatus and bonding method of the present invention, a plurality of load sensors is arranged on a substrate in a matrix form. Load to a bonding portion, applied within the upper and lower thresholds for the allowable load that have been previously set for each position where the load sensor detects load, is feedback-controlled, and the stress distribution over the substrate stage surface can be monitored. Thus, it is possible to increase the accuracy and reliability of the load detection mechanism upon bonding of the electronic component to the substrate (i.e., upon production of products).

Since it is possible to find during a bonding operation troubles (e.g., inclination of the bonding tool, contamination of foreign material, variations in the level of bumps, connection failures between substrate's connection terminals, abnormal lifting and lowering of the bonding tool, and wearing away and/or failure of the lifting and lowering mechanism), the occurrence of abnormalities and/or the presence of defective pieces can be immediately determined, allowing a stable production management at all times without involving continued production of defective pieces. Thus, it is possible to provide high-quality products with high yields.

In addition, when abnormalities have occurred, alarms can be issued and the operation of the apparatus can be halted, thus ensuring the traceability of products for quality management.

Conventional Example

Figure 10A:
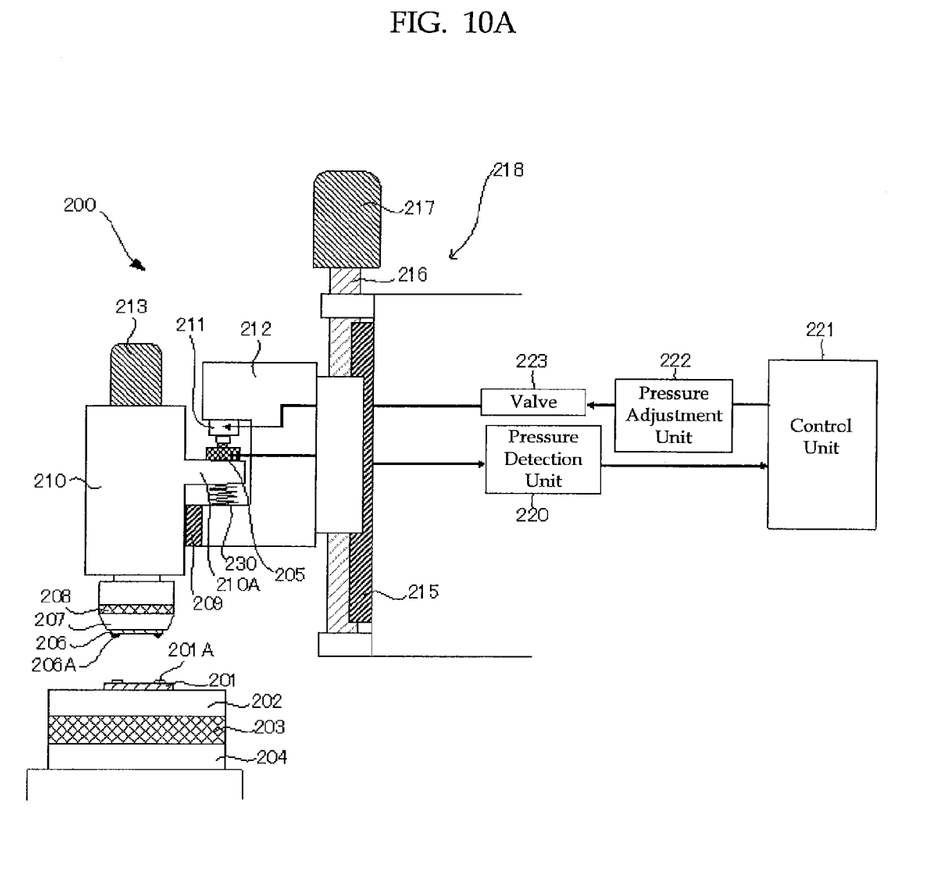
FIG. 10A is a cross-sectional view for explaining an example of the schematic configuration of a conventional bonding apparatus.
Figure 10B:
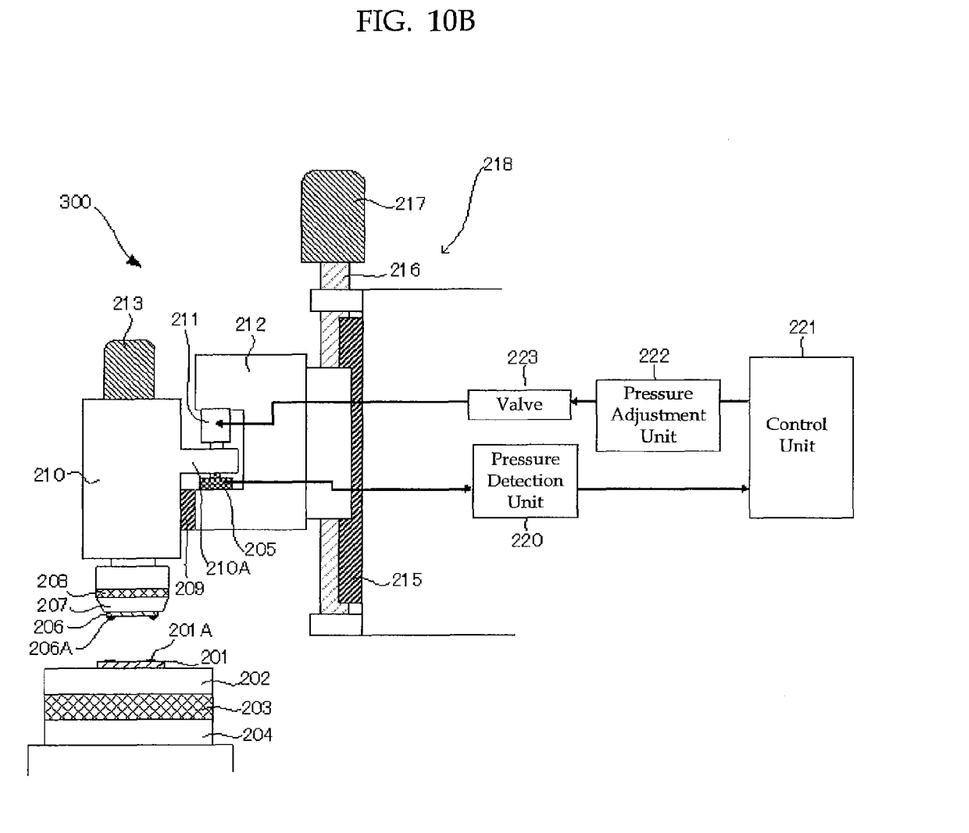
FIG. 10B is a cross-sectional view for explaining another example of the schematic configuration of a conventional bonding apparatus.

FIGS. 10A and 10B each shows a schematic configuration of a conventional bonding apparatus.

The bonding apparatus shown in FIG. 10A includes a bonding head 200. The bonding head 200 includes a bonding tool support 210 having a bonding tool 207 which operates by attaching an electronic component 206 by vacuum thereto and a heat mechanism 208 for heating the bonding tool 207 to heat bumps 206A formed on an electronic component 206. In the bonding tool support 210, a protruding part 210A is engaged with a cylinder 211 attached to a C-shaped lifting and lowering block 212, and the lower surface of the protruding part 210A is biased against the lifting and lowering block 212 by a spring 230. The bonding tool support 210 is held by the lifting and lowering block 212 via a slidable slide guide 209. In addition, a rotary motor 213 is arranged on the top of the bonding tool support 210. The rotary motor 213 carries out a rotation correction upon positioning of the electronic component 206. A load sensor 205 for detecting the pressing force of the bonding tool 207 is arranged on the bonding tool support 210 beneath the cylinder 211.

The lifting and lowering block 212 is connected to a lifting and lowering mechanism 218 which is comprised of a slide guide 215, a feed screw 216, and a lifting and lowering motor 217 arranged on the top of the feed screw 216, and the flat side wall of the C-shaped lifting and lowering mechanism 212 is held by the feed screw 216 via the slidable slide guide 215. The lifting and lowering block 212 connected to the lifting and lowering mechanism 218 is allowed to move vertically, causing the bonding tool 207 to move vertically accordingly.

A substrate 201 having connection terminals 201A formed thereon is placed on a substrate attachment plate 202 that holds the substrate 201 by vacuum. Under the substrate attachment plate 202, a substrate heater 203 for heating the substrate 201 and heat insulating material 204 are provided.

After the signal from the load sensor 205 has been detected by a pressure detection unit 220 and transmitted to a control unit 221, the control unit 221 controls a pressure adjustment unit 222, causing the pressure detection unit 222 to adjust the flow rate of a valve 223. In this way the pressing force of the bonding tool 207 is controlled.

Meanwhile, a conventional bonding apparatus shown in FIG. 10B includes a bonding head 300. The bonding head 300 is similar to the bonding head 200 shown in FIG. 10A except that a load sensor 205 is arranged on a lifting and lowering block 212 beneath a protruding part 210A of a bonding tool support 210.

Thus, in the conventional bonding apparatus shown in FIGS. 10A and 10B, there are many parts constituting the lifting and lowering mechanism 218, bonding tool support 210, heating mechanism 208, etc. around the position where the load sensor 205 is provided. For this reason, the load sensor 205 is susceptible to heat generated due to friction of these parts; thus the load sensor 205 tends to produce varying values for the detected load. Moreover, since such produced values merely indicate load acting on the bonding tool 207 itself, the conventional bonding apparatus cannot find during a bonding operation troubles (e.g., inclination of the bonding tool, contamination of foreign material, variations in the level of bumps, connection failures between substrate's connection terminals, abnormal lifting and lowering of the bonding tool, and wearing away and/or failure of the lifting and lowering mechanism) like the foregoing bonding apparatus according to the first embodiment. Accordingly, products obtained using such conventional bonding apparatus are of less quality than those obtained using the bonding apparatus according to the first embodiment, resulting in reduced production yields.

According to the present invention it is possible to solve the foregoing conventional problems and to provide a bonding apparatus capable of increasing product quality by realizing high-precision control of a pressing force applied upon mounting of an electronic component on a substrate by bonding, and to a bonding method capable of providing high-quality products stably.

The bonding apparatus of the present invention controls pressing force with high precision when mounting an electronic component on a substrate by bonding, thereby increasing product quality. Moreover, when abnormalities have occurred, alarms can be issued and/or the operation of the bonding apparatus can be halted, thus ensuring the traceability of products for quality management. For these reasons, the bonding apparatus of the present invention can be suitably used for bonding of flash memories, DRAMs, and FRAMs.

The bonding method of the present invention controls pressing force with high precision to achieve stable mounting of an electronic component on a substrate. Thus, with the bonding method of the present invention, it is possible to provide high-quality products with high yields without involving continued production of defected pieces.

What is claimed is:

1. A method of detecting a bonding abnormality, comprising:
   pressing an electronic component against a substrate to bond the electronic component to the substrate;
   monitoring individual pressure values, as a function of time, applied to the substrate during the pressing by using a plurality of load detection mechanisms placed at different locations under the substrate, wherein each of said load detection mechanisms detects respective pressure value; and
   detecting the bonding abnormality by detecting a time lag, the time-lag being a difference in time between a time of a start of the pressing and a time at which all of the pressure values reach same value.

2. The method of detecting a bonding abnormality according to claim 1, wherein the load detection mechanisms are disposed at equal intervals.

3. The method of detecting a bonding abnormality according to claim 1, wherein the electronic component has a polygonal shape, and the load detection mechanisms are disposed at positions corresponding to corners of the electronic component.

4. The method of detecting a bonding abnormality according to claim 1, wherein the electronic component has a square shape, and the load detection mechanisms are disposed at positions corresponding to corners of the electronic component.

5. The method of detecting a bonding abnormality according to claim 1, wherein the load detection mechanisms are disposed in a matrix form.

6. The method of detecting a bonding abnormality according to claim 1, wherein traceability is ensured for bonding between the electronic component and the substrate on a basis of the pressure values.

7. The method of detecting a bonding abnormality according to claim 1, further comprising: detecting a second bonding abnormality when one of the pressure values is outside of a first reference range and detecting a third bonding abnormality when any two values among the pressure values differ.

8. The method of detecting a bonding abnormality according to claim 7, further comprising:
   wherein the plurality of load detection mechanisms placed at different locations under the substrate are placed in rows; and
   detecting of a fourth bonding abnormality of the pressing when a sum of the pressure values of each row of the load detection mechanisms is outside of a second reference range.

* * * * *